(12) United States Patent
Asao

(10) Patent No.: US 6,787,952 B2
(45) Date of Patent: Sep. 7, 2004

(54) ALTERNATOR

(75) Inventor: Yoshihito Asao, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 169 days.

(21) Appl. No.: 10/243,928

(22) Filed: Sep. 16, 2002

(65) Prior Publication Data

US 2003/0015928 A1 Jan. 23, 2003

Related U.S. Application Data

(63) Continuation of application No. 09/690,829, filed on Oct. 18, 2000, now Pat. No. 6,525,438.

(30) Foreign Application Priority Data

Mar. 15, 2000 (JP) .......................... 2000-72740

(51) Int. Cl.[7] ................................. H02K 7/02
(52) U.S. Cl. ...................... 310/68 D; 310/68 R; 310/64
(58) Field of Search ............................ 310/68 D, 68 R, 310/64, 67 R; 363/141, 145

(56) References Cited

U.S. PATENT DOCUMENTS

| | | | |
|---|---|---|---|
| 5,296,778 A | | 3/1994 | Stroud |
| 5,652,471 A | * | 7/1997 | Mayer et al. ............. 310/68 D |
| 5,659,212 A | * | 8/1997 | DePetris ................... 310/68 D |
| 5,682,070 A | | 10/1997 | Adachi et al. |
| 5,866,963 A | | 2/1999 | Weiner et al. |
| 5,883,450 A | | 3/1999 | Abadia et al. |
| 5,892,308 A | | 4/1999 | Abadia et al. |
| 5,977,669 A | | 11/1999 | Yoshida et al. |
| 6,198,188 B1 | | 3/2001 | Ihata |
| 6,275,404 B1 | | 8/2001 | Shichijyo et al. |

FOREIGN PATENT DOCUMENTS

JP          7-123663 A        5/1995

* cited by examiner

*Primary Examiner*—Thanh Lam
(74) *Attorney, Agent, or Firm*—Sughrue Mion, PLLC

(57) ABSTRACT

An alternator exhibits uniform temperature distribution in a rectifier, thereby preventing a locally hot spot from being developed. Positive-side diodes and negative-side diodes are arranged in a zigzag pattern in a circumferential direction, and formed of diodes on an inside diameter side and diodes on an outside diameter side.

7 Claims, 16 Drawing Sheets

ALTERNATOR

This is a continuation of application Ser. No. 09/690,829 filed Oct. 18, 2000, now U.S. Pat. No. 6,525,438, which is hereby incorporated by reference.

BACKGROUND OF THE INVENTION

1. Field of the Invention

The present invention relates to an alternator equipped with a rectifier for rectifying alternating current generated at a stator coil into direct current.

2. Description of the Related Art

FIG. 10 is a sectional view of a conventional automotive alternator, FIG. 11 is an electrical circuit diagram of the alternator, FIG. 12 is a front view of a rectifier 12 of FIG. 10 when the rectifier 12 is observed from inside, and FIG. 13 is a front view of a rear bracket 2 of FIG. 10.

The automotive alternator includes: a case 3 composed of an aluminum front bracket 1 and an aluminum rear bracket 2; a shaft 6 rotatably disposed in the case 3 and which has a pulley 4 secured to one end thereof; a Lundell-type rotor 7 secured to the shaft 6; a stator 8 secured to an inner wall of the case 3; a slip ring 9 secured to the other end of the shaft 6 and which supplies electric current to the rotor 7; a pair of brushes 10 that slide in contact with the slip ring 9; a brush holder 11 accommodating the brushes 10; a rectifier 12 electrically connected to the stator 8 and which rectifies alternating current generated in the stator 8 into direct current; a heat sink 17 fitted in the brush holder 11; and a regulator 18 adhesively fastened to the heat sink 17 and which adjusts an alternating voltage generated in the stator 8.

The rotor 7 is equipped with a rotor coil 13 for generating magnetic flux on passage of electric current, and a pole core 14 covering the rotor coil 13 in which magnetic poles are produced by the magnetic flux. The pole core 14 has a pair of a first pole core assembly 21 and a second pole core assembly 22 that intermesh with each other. Centrifugal fans 5 for cooling are welded on axial end surfaces of the first pole core assembly 21 and the second pole core assembly 22.

The stator 8 is provided with a stator core 15 through which a rotating magnetic field generated by the rotor 7 passes, and a stator coil 16 in which alternating current is generated by the rotating magnetic field. The stator coil 16 is constructed by a first stator coil section 16a and a second stator coil section 16b, each being formed of three coils whose conductors are wound around the stator core 15 and which are in Y-connection.

FIG. 14 is a front view of the rectifier 12, and FIGS. 15 and 16 are exploded front views of the rectifier 12 of FIG. 14. The rectifier 12 includes positive-side diodes 26 and negative-side diodes 28 connected to output ends of the first stator coil section 16a and the second stator coil section 16b, and neutral point diodes 30 connected to neutral points 31 of the first stator coil section 16a and the second stator coil section 16b.

The rectifier 12 further includes: a circular strip-shaped positive-side heat sink 24 having, on its surface, six positive-side diodes 26 and two neutral point diodes 30 equidistantly provided on the same circumference; a circular strip-shaped negative-side heat sink 27 disposed radially outside of and on the same plane as the positive-side diodes 26, and has, on its surface, six negative-side diodes 28 and two neutral point diodes 30 equidistantly provided on the same circumference; and a circuit board 29 electrically connecting the diodes 26, 28, and 30, and the stator coil 16.

The surfaces of the positive-side heat sink 24 and the negative-side heat sink 27 have recesses 32 and 33 for accommodating the columnar positive-side diodes 26, the negative-side diodes 28, and the neutral point diodes 30. FIG. 17 shows the positive-side heat sink 24 and the negative-side heat sink 27 of the FIG. 15 as observed from a rear side. On the rear surfaces of the heat sinks 24 and 27, protuberances 34 and 35 are formed at the same time when the recesses 32 and 33 are formed.

The positive-side diodes 26, the negative-side diodes 28, and the neutral point diodes 30 are fixed to the recesses 32 and 33 of the heat sinks 24 and 27 by soldering. Perpendicularly extending lead wires 36 and 37 of the diodes 26, 28, and 30 are electrically connected to terminals 38 and 39 of the circuit board 29.

The positive-side heat sink 24 is retained on the negative-side heat sink 27 via a holder 40. The positive-side heat sink 24, the negative-side heat sink 27, and the circuit board 29 are fixed in the case 3 by screws (not shown) attached to the rear bracket 2 via through holes 41. Furthermore, the negative-side heat sink 27 is grounded by being directly attached to the rear bracket 2.

In the automotive alternator having the construction set forth above, electric current is supplied from a battery (not shown) to the rotor coil 13 via the brushes 10 and the slip ring 9, generating magnetic flux. The pulley 4 is driven by an engine, and the rotor 7 is rotated by the shaft 6. This causes a rotating magnetic field to be imparted to the stator coil 16, so that an electromotive force is generated in the stator coil 16. The alternating electromotive force is converted into direct current through the positive-side diodes 26 and the negative-side diodes 28 of the rectifier 12, a magnitude thereof is adjusted by the regulator 18, and the battery is recharged.

The rotor coil 13, the stator coil 16, the positive-side diodes 26, the negative-side diodes 28, and the regulator 18 constantly generate heat during power generation. When an alternator of, for example, a 100 A rated output current class, runs at a speed generating a high temperature, the rotor coil 13 generates a calorific value of 60 W, the stator coil 16 generates a caloric value of 500 W, the positive-side diodes 26 and the negative-side diodes 28 together generate a calorific value of 120 W, and the regulator 18 generates a calorific value of 6 W. Excessive heat generation causes deteriorated performance of the alternator and shortens lives of components.

As countermeasures for the heat generation, the fans 5 rotate as the rotor 7 rotates. The rotation of the fans 5 causes outside air to be introduced into the case 3 through an aperture A of the case 3, and to flow as indicated by arrows α of FIG. 10 to thereby cool the negative-side heat sink 26, the negative-side diodes 28, the positive-side heat sink 24, and the positive-side diodes 26. The outside air is then led radially outward by the fans 5 to cool a coil end of the stator coil 16 at the rear side, and exhausted to open air through an aperture B.

Furthermore, the rotation of the fans 5 causes outside air to be introduced into the case 3 also through an aperture C. The outside air flows as indicated by arrows β of FIG. 10 to cool a power transistor of the regulator 18. The outside air is then led radially outward by the fans 5 to cool a coil end of the stator coil 16 at the rear side, and exhausted to open air through an aperture D.

Similarly, outside air introduced through apertures E of the front bracket 1 is directed radially outward by the fans 5 to cool an end of the stator coil 16 at a front side. The outside air is then exhausted out of the case 3 through an aperture F.

In the automotive alternator having the construction described above, the lead wires 36 and 37 of the positive-side diodes 26 and the negative-side diodes 28, which extend in an axial direction of the shaft 6, are directly abutted against the terminals 38 and 39 of the circuit board 29. For this reason, the six positive-side diodes 26 and the two neutral point diodes 30 are disposed at equal intervals on the circumference of the positive-side heat sink 24, and the six negative-side diodes 28 and the two neutral point diodes 30 are disposed at equal intervals on the circumference of the negative-side heat sink 27. Therefore, the positive-side diodes 26, in particular, on the positive-side heat sink 24 on an inside diameter side are close to each other. When a distance between central points of the positive-side diodes 26 is denoted as W, and a diameter of the positive-side diodes 26 is denoted as D, a value expressed as W/D≅1.5 is obtained. A study of temperature distribution of the rectifier 12 has revealed that the temperature rises toward a center in a circumferential direction of the positive-side heat sink 24, a difference between temperature extremes being approximately 13 degrees Celsius, while the temperature rises inward in a radial direction, a difference between temperature extremes being approximately 3 degrees Celsius. There has been a problem in that the positive-side diode 26 at the center of the positive-side heat sink 24 where the temperature is the highest reaches a locally high temperature, 125 degrees Celsius.

SUMMARY OF THE INVENTION

Accordingly, the present invention has been made with a view toward solving the problems described above, and it is an object thereof to provide an alternator that exhibits uniform temperature distribution in a rectifier, thereby preventing a locally hot place from being developed.

To this end, according to one aspect of the present invention, there is provided an alternator having at least a first diode assembly or a second diode assembly composed of diodes on an inside diameter side and diodes on an outside diameter side arranged in a zigzag pattern in a circumferential direction.

In a preferred form of the alternator in accordance with the present invention, the diodes on the inside diameter side and the diodes on the outside diameter side are provided in recessions of a heat sink having a recessed surface, and protuberances associated with the recesses are formed in a rear surface of the heat sink.

In a preferred form of the alternator in accordance with the present invention, one of the diode on the inside diameter side and the diode on the outside diameter side is disposed such that it is partly included in a region of an air detachment portion produced on a peripheral surface by cooling air that collides with the other of the diode on the inside diameter side and the diode on the outside diameter side.

In another preferred form of the alternator in accordance with the present invention, if a distance between a central point of a columnar diode on the inside diameter side and a central point of its adjacent columnar diode on the outside diameter side is denoted as W, and a diameter of the diode on the inside diameter side and the diode on the outside diameter side is denoted as D, then (W/D)<2. Furthermore, if an angle at which a line connecting a central point of the diode on the inside diameter side and a central point of its adjacent diode on the outside diameter side crosses a line connecting a central axis of a shaft and the central point of the diode on the outside diameter side or the diode on the inside diameter side is denoted as θ, then angle θ is 100°<θ<140°.

In a preferred form of the alternator according to the present invention, diodes on the outside diameter side that are secured to the second heat sink are disposed so as to oppose the diodes on the outside diameter side that are secured to the first heat sink.

In a preferred form of the alternator according to the present invention, the diodes on the outside diameter side and the diodes on the inside diameter side that are secured to the second heat sink are disposed away from radial lines of the diodes on the outside diameter side and the diodes on the inside diameter side that are secured to the first heat sink.

In a preferred form of the alternator according to the present invention, the first heat sink and the second heat sink are disposed on different vertical planes with respect to axes.

In a preferred form of the alternator according to the present invention, the first heat sink is a positive-side heat sink, the first diode assembly is a positive-side diode assembly, the second heat sink abutted against the case is a negative-side heat sink, and the second diode assembly is a negative-side diode assembly.

DESCRIPTION OF THE PREFERRED EMBODIMENTS

Figure 1:
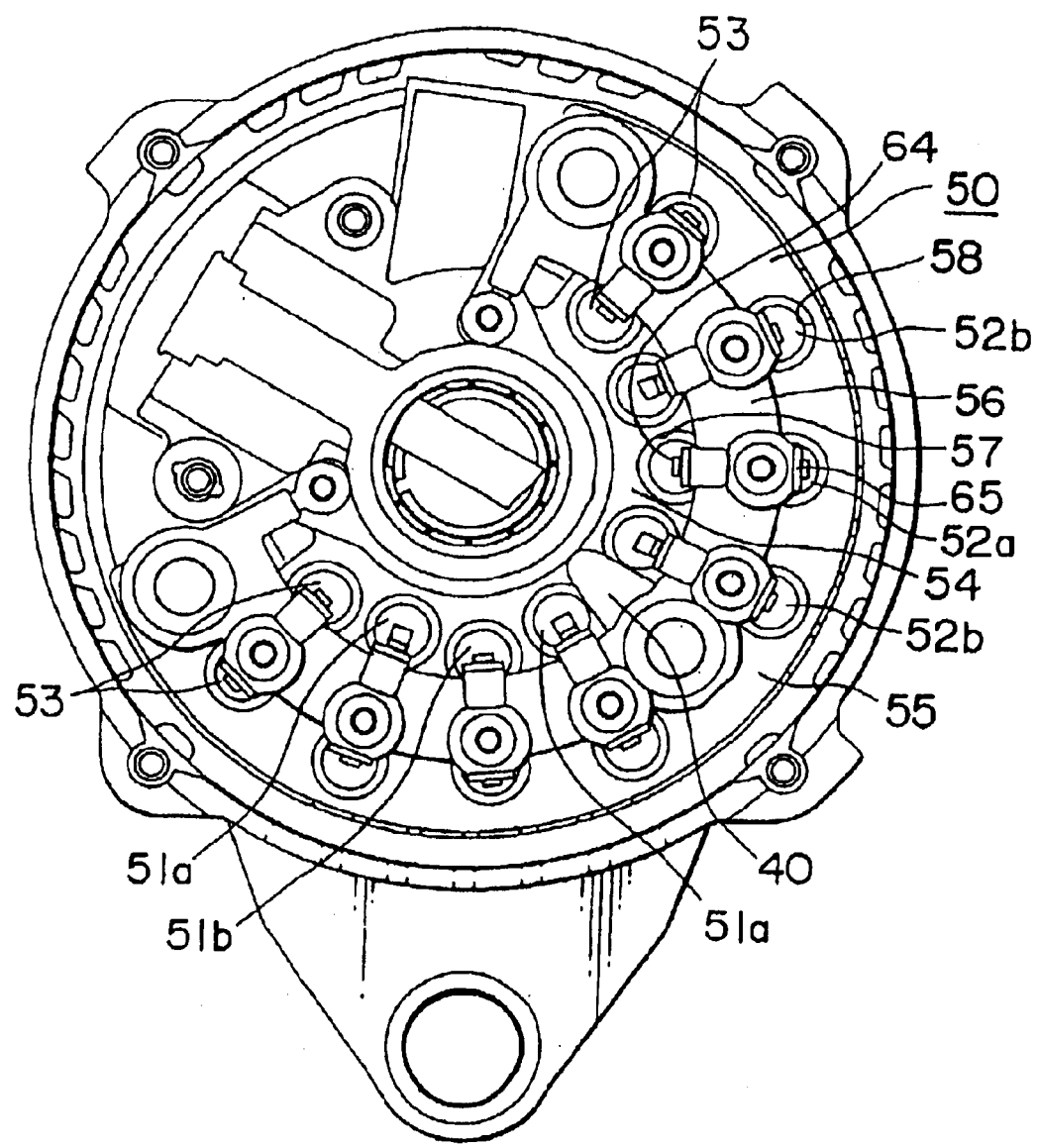
FIG. 1 is a front view of a rectifier of an automotive alternator according to a first embodiment of the present invention.

An automotive alternator according to a first embodiment of the present invention will be described. Components that are the same as or equivalent to those shown in FIG. 10 through FIG. 17 will be assigned the same reference numerals in the descriptions.

First Embodiment

Figure 2:
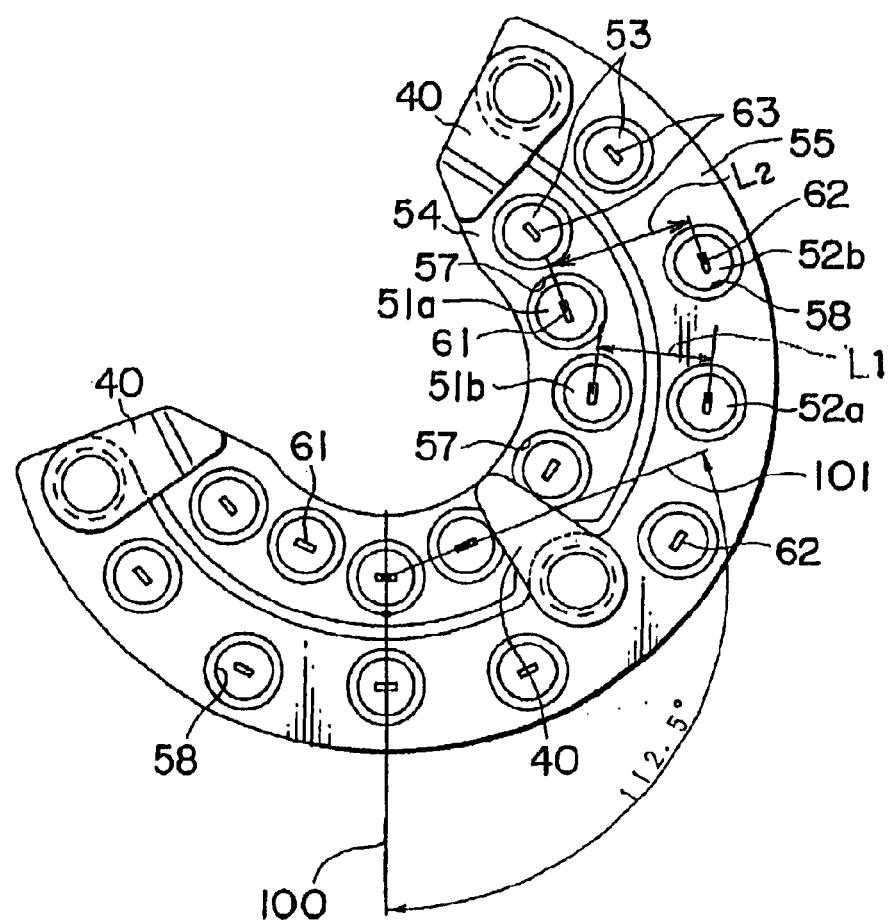
FIG. 2 is a front view of the rectifier shown in FIG. 1, from which a circuit board has been removed.

FIG. 1 is a front view of a rectifier 50 of an automotive alternator according to the first embodiment of the present invention, and FIG. 2 is a front view of the rectifier 50, from which a circuit board 56 shown in FIG. 1 has been removed.

The rectifier 50 includes: positive-side diodes 51a and 51b, which are first diodes, and negative-side diodes 52a and 52b, which are second diodes, the first and second diodes being connected to output ends of a first stator coil section 16a and a second stator coil section 16b, respectively; and neutral point diodes 53 connected to neutral points 31 of the first stator coil section 16a and the second stator coil section 16b.

The rectifier 50 further includes: a circular strip-shaped positive-side heat sink 54 which is a first heat sink and has, on its surface, six positive-side diodes 51a and 51b and two neutral point diodes 53; a circular strip-shaped negative-side heat sink 55, which is a second heat sink, disposed a radially outside of and on the same plane as the positive-side heat sink 54, and has, on its surface, six negative-side diodes 52a and 52b, and two neutral point diodes 53; and a circuit board 56 electrically connecting the diodes 51a, 51b, 52a, 52b, and 53, and a stator coil 16.

Figure 3:
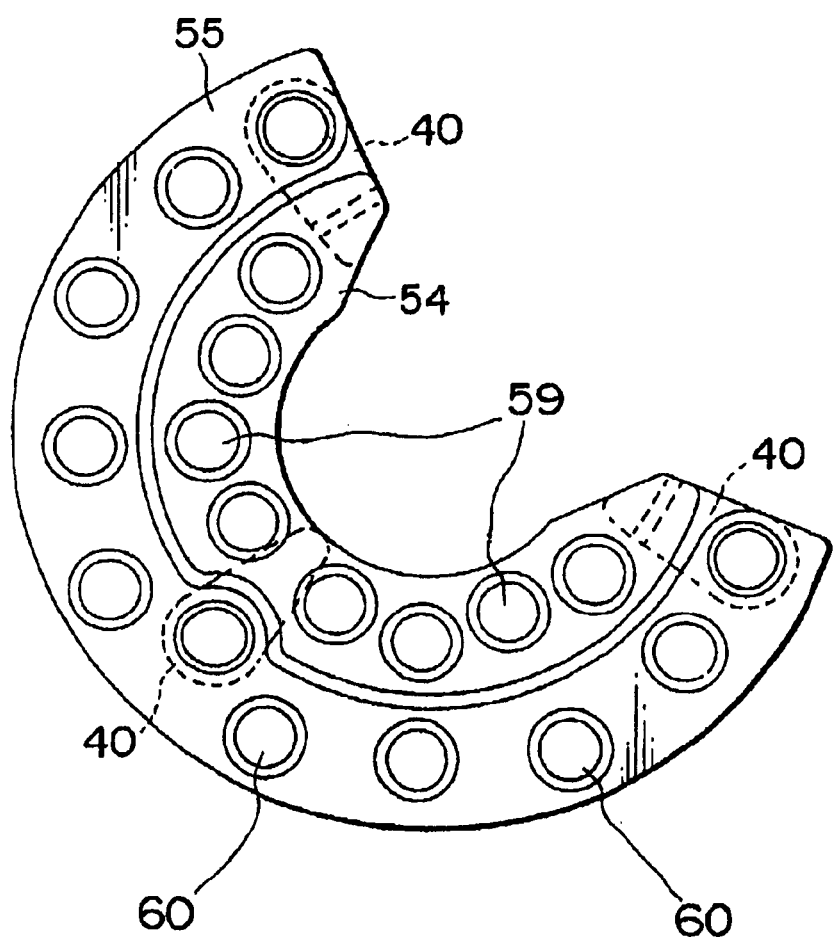
FIG. 3 is a rear view of the rectifier shown in FIG. 2.

The surfaces of the positive-side heat sink 54 and the negative-side heat sink 55 have recesses 57 and 58 formed to accommodate the columnar positive-side diodes 51a and 51b (the diodes 51a are located on an inside diameter side, while the diodes 51b are located on an outside diameter side), the negative-side diodes 52a and 52b (the diodes 52a are located on the inside diameter side, while the diodes 52b are located on the outside diameter side), and the neutral point diodes 53. FIG. 3 shows the positive-side heat sink 54 and the negative-side heat sink 55 of the FIG. 2, as observed from a rear side. On the rear surfaces of the heat sinks 54 and 55, protuberances 59 and 60 are formed at the same time when the recesses 57 and 58 are formed.

The positive-side diodes 51a and 51b, the negative-side diodes 52a and 52b, and the neutral point diodes 53 are fixed to the recesses 57 and 58 of the heat sinks 54 and 55 by soldering. Lead wires 61, 62, and 63 of the diodes 51a, 51b, 52a, 52b, and 53 are electrically connected to terminals 64 and 65 of the circuit board 56.

Positive-side diodes 51a and 51b on the positive-side heat sink 54 are alternately arranged on the inside diameter side and the outside diameter side of the positive-side heat sink 54 in a zigzag pattern in a circumferential direction. Similarly, negative-side diodes 52a and 52b on the negative-side heat sink 55 are alternately arranged on the inside diameter side and the outside diameter side of the negative-side heat sink 55 in a zigzag pattern in a circumferential direction. Hence, a distance L1 between the positive-side diode 51a and the negative-side diode 52b that are radially adjacent is different in the circumferential direction from a distance L2 between the positive-side diode 51b and the negative-side diode 52a that are radially adjacent. Therefore, when electrically connecting the lead wires 61, 62, and 63 of the diodes 51a, 51b, 52a, 52b, and 53 to the terminals 64 and 65 of the circuit board 56, the lead wires 61, 62, and 63 are bent in the middle thereof for the greater distance L2.

The positive-side heat sink 54 is retained on the negative-side heat sink 55 via a holder 40. The positive-side heat sink 54, the negative-side heat sink 55, and the circuit board 56 are fixed in a case 3 by screws (not shown) attached to a rear bracket 2 via through holes 41. Furthermore, the negative-side heat sink 55 is grounded by being directly attached to the rear bracket 2.

In this embodiment, the positive-side diodes 51a and 51b are disposed so that, when a distance between central points of the positive-side diodes 51a and 51b is denoted as W, and a diameter of the positive-side diodes 51a and 51b is denoted as D, a value expressed as W/D≅1.5 is obtained, and an angle at which a line 100 connecting a center point of the diode 51b on the outside diameter side (hereinafter referred to simply as "the outer diode 51b") on the positive-side heat sink 54 and a center point of the rectifier 50 intersects with a line 101 connecting the center point of the outer diode 51b and a center point of the diode 51a on the inside diameter side (hereinafter referred to simply as "the inner diameter 51a") adjacent to the diode 51b is 112.5 degrees.

A study of temperature distribution of the rectifier 50 under the same conditions as those of a conventional rectifier has revealed that the temperature rises toward a center in a circumferential direction, a difference between temperature extremes being approximately 10 degrees Celsius, meaning a temperature drop of 5 degrees Celsius. Furthermore, the temperature rises inward in a radial direction, a difference between temperature extremes being approximately 1 degree Celsius, meaning a temperature drop of 2 degrees Celsius. Temperatures of the positive-side diodes 51a and 51b at a central portion of the positive-side heat sink 54, which are the highest temperatures, are 120 degrees Celsius, which indicates a temperature drop of 5 degrees Celsius.

Thus, the temperature distribution of the rectifier 50 has become even, and the maximum temperature of the positive-side diodes 51a and 51b has dropped. The improved cooling efficiency is considered to be due to the following reason.

Figure 4:
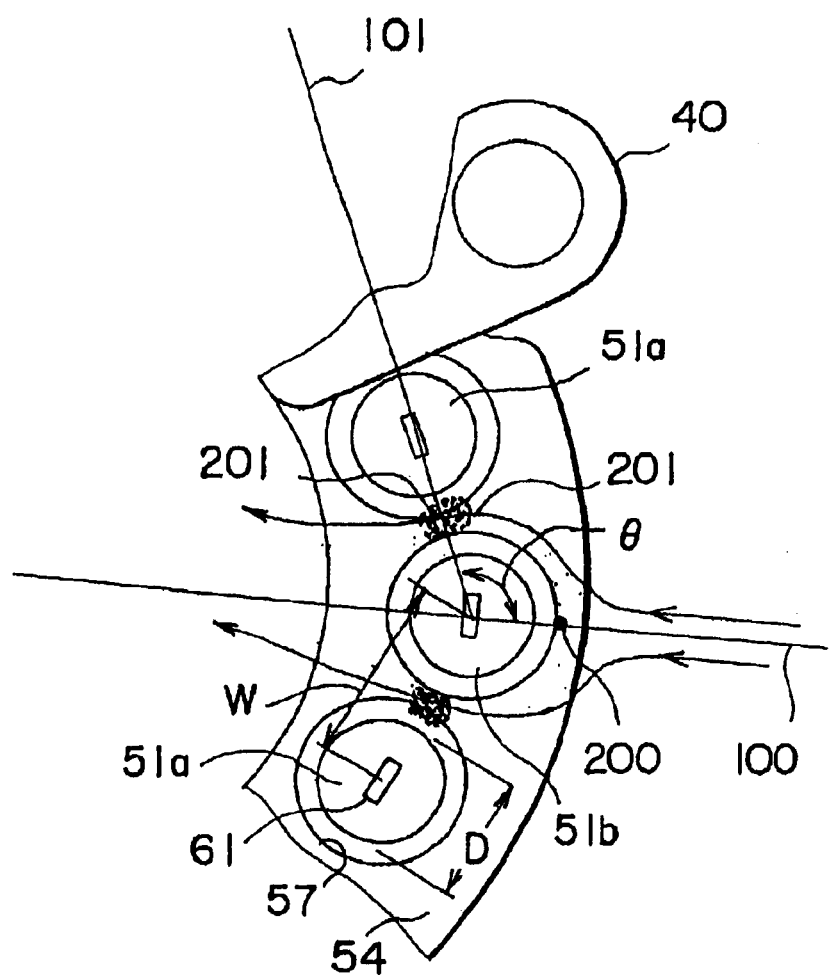
FIG. 4 is an enlarged view of an essential section of the rectifier shown in FIG. 2.

FIG. 4 is a partial enlarged view of the positive-side heat sink 54, which is the first heat sink, and shows a flow of air that collides against the columnar outer diode 51b on the positive-side heat sink 54 and moves along side surfaces thereof. When the air collides against the diode 51b, it branches onto the two sides thereof, and the flow is blocked at a branching point, resulting in zero velocity. Behind that point, namely, a stagnation point 200, a laminar boundary layer is formed along the side surfaces, then the branched flow is detached from the side surfaces. At the rear, a detached air portion 201 wherein a vortex or backflow is generated is formed. The inner diodes 51a are disposed most closely to the detached air portion 201. Thus, it is considered that the inner diodes 51a are partly involved in the detached air portion 201, which is a turbulent area, leading to promoted heat transfer on peripheral wall surfaces of the inner diodes 51a.

Figure 5:
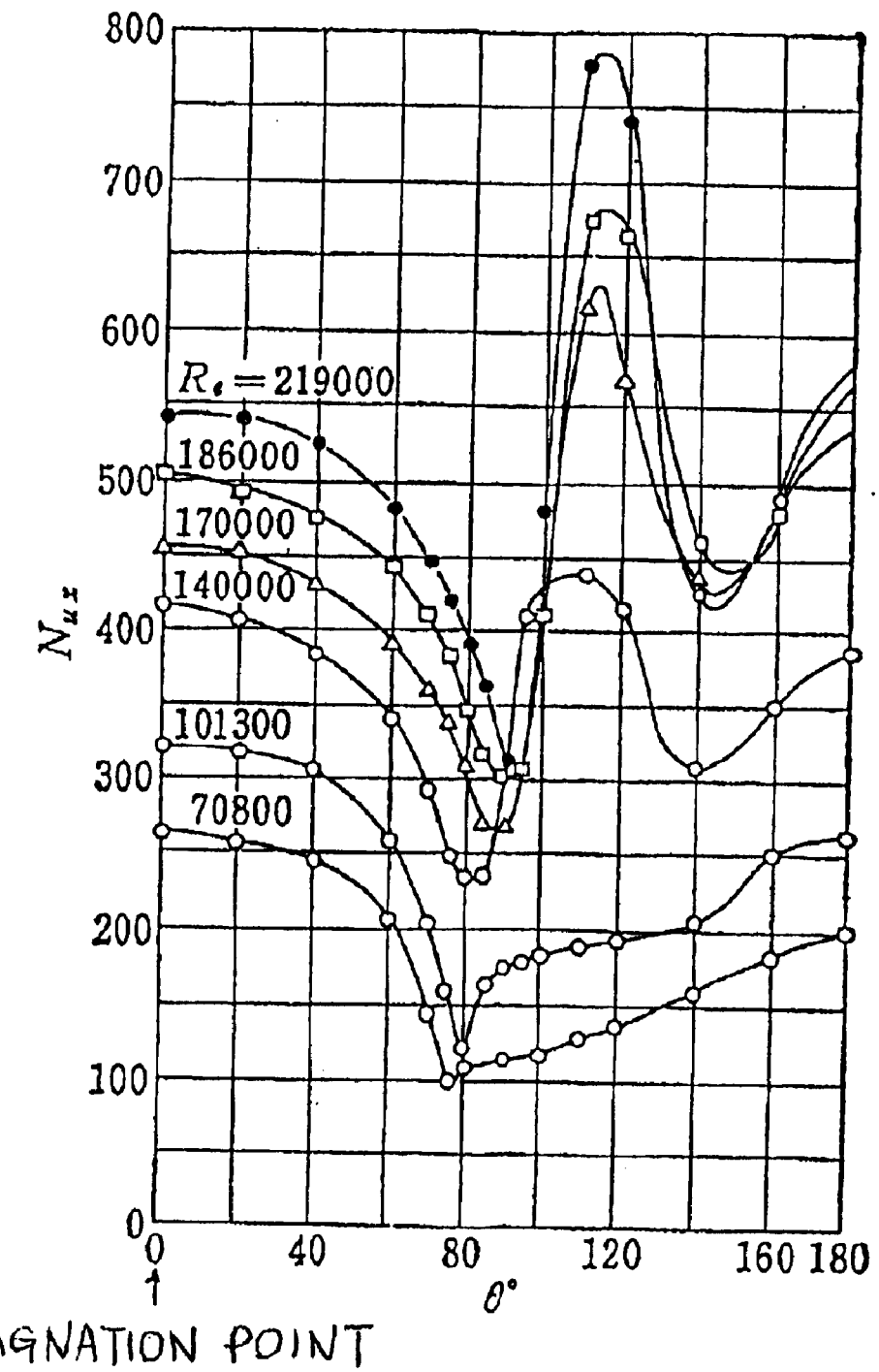
FIG. 5 is a chart showing a local Nusselt number Nux of a column placed at right angles to a flow.

FIG. 5 shows local Nusselt number Nux of a column placed at right angles to a flow ($\alpha$xD/$\lambda$, where $\alpha$x denotes a local heat transfer coefficient on the column, D denotes a diameter of the column, and $\lambda$ denotes thermal conductivity of a fluid. The values of diameter D and thermal conductivity $\lambda$ are fixed, so that a larger value of Nux means better local heat transfer). This information is provided on page 168 of "Thermal Conductology" published by Rikogaku. In the chart, the axis of abscissa indicates an angle $\theta$(the angle $\theta$ is 180 degrees at a position opposing the stagnation point) from the stagnation point 200 to a predetermined position on a side surface of the column, the stagnation point 200 being zero, and the axis of ordinates indicates the Nusselt number at the predetermined position. As can be understood from the chart, the Nusselt number shows larger values when the angle $\theta$ is in a range of 100 to 140 degrees. In other words, it is considered that the Nusselt number shows especially larger values due to the generated detached air portion 201.

Accordingly, setting the angle θ to the range of 100 to 140 degrees in FIG. 4 causes an air layer of the peripheral wall surfaces of the adjoining inner diodes 51a to be disturbed due to influences exerted by the detached air portion 201 produced by the outer diode 51b. This permits the positive-side diode 51b to be efficiently cooled.

In order to cause the adjoining inner diodes 51a to be influenced by the detached air portion 201, the outer diode 51b must be close to the inner diodes 51a to a certain extent. Influences exerted by a flow around the column have been disclosed by many examples of experiments carried out in the past. Results of such experiments have revealed that the influences are exerted on adjoining columns when (W/D)<2 (refer to, for example, VIII-INTERFERENCE DRAG 8-2).

Thus, in the automotive alternator according to the first embodiment set forth above, the inner diodes 51a and the outer diodes 51b on the positive-side heat sink 54 are arranged in the zigzag pattern in the circumferential direction, and the inner diodes 51a are subjected to the influences of the detached air portion 201 generated at the outer diode 51b. This arrangement ensures efficient cooling of the inner diodes 51a. Similarly, the protuberances 59 on the rear side of the positive-side heat sink 54 produces the detached air portion, and the heat transfer of the protuberance 59 adjacent to the detached air portion is promoted, also causing the rear side of the positive-side heat sink 54 to be efficiently cooled.

In addition, the negative-side diodes 52a and the negative-side diodes 52b on the negative-side heat sink 55, which is the second heat sink, are also arranged in the zigzag pattern in the circumferential direction. Hence, a distance between adjoining negative-side diodes 52a and 52b is greater than it would if they were arranged on the same circumference, resulting in a reduced ventilation drag. This leads to increased ventilation with consequent higher efficiency of cooling the entire rectifier 50.

Second Embodiment

Figure 6:
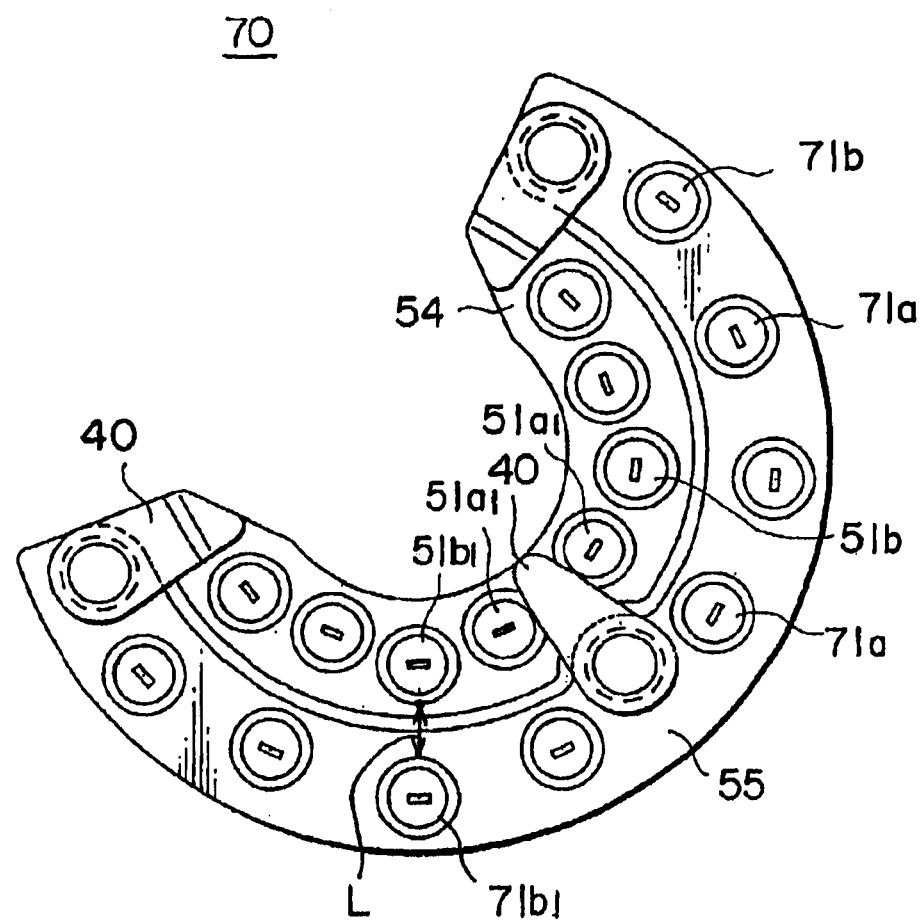
FIG. 6 is a front view of a rectifier of an automotive alternator according to a second embodiment of the present invention.

FIG. 6 is a front view of a rectifier 70 of an automotive alternator according to a second embodiment of the present invention, a circuit board thereof having been removed. The construction of the second embodiment is the same as that of the first embodiment except that a layout of negative-side diodes 71a and 71b, which are second diodes, is different.

The second embodiment is adapted to enhance influences of a detached portion 201 from an outer diode 51b1 adjacent to an inner diode 51a1 (a central portion of the positive-side heat sink 54, which is a first heat sink) where temperature is the highest. More specifically, in order to increase a volume of air colliding with the outer diode 51b1 adjacent to the inner diode 51a1 at the central portion, a distance L between the outer diode 51b1 and an outer diode 71b1 radially located on an outer side is increased by disposing the outer diode 71b1 on an outer diameter side of a negative-side heat sink 55, which is a second heat sink.

Third Embodiment

Figure 7:
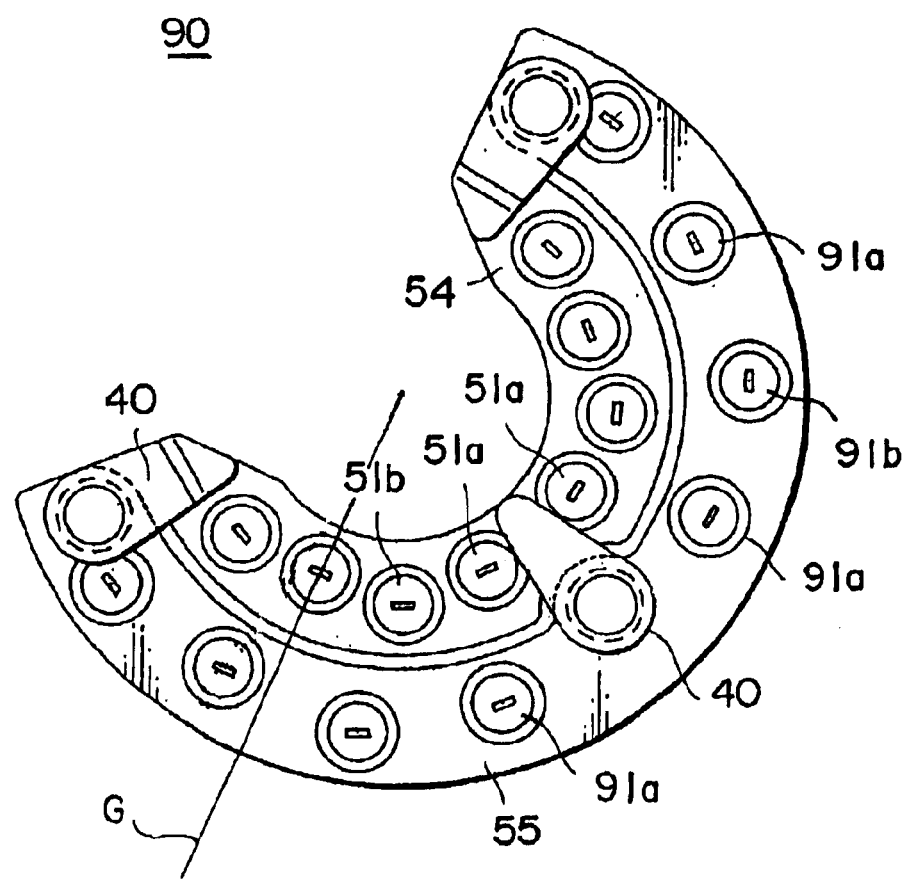
FIG. 7 is a front view of a rectifier of an automotive alternator according to a third embodiment of the present invention.

FIG. 7 is a front view of a rectifier 90 of an automotive alternator according to a third embodiment of the present invention, a circuit board thereof having been removed therefrom. The construction of the third embodiment is the same as that of the second embodiment except that a layout of negative-side diodes 91a and 91b, which are second diodes, is different.

In the third embodiment, the outer diodes 91b and the inner diodes 91a are disposed away from a radial line G of outer diodes 51b and inner diodes 51a secured to a positive-side heat sink 54, which is a first heat sink. This arrangement increases a volume of cooling air that flows inward in a radial direction and collides with the outer diodes 51b and the inner diodes 51a secured to the positive-side heat sink 54, thus further efficiently cooling the outer diodes 51b and the inner diodes 51a.

Fourth Embodiment

Figure 8:
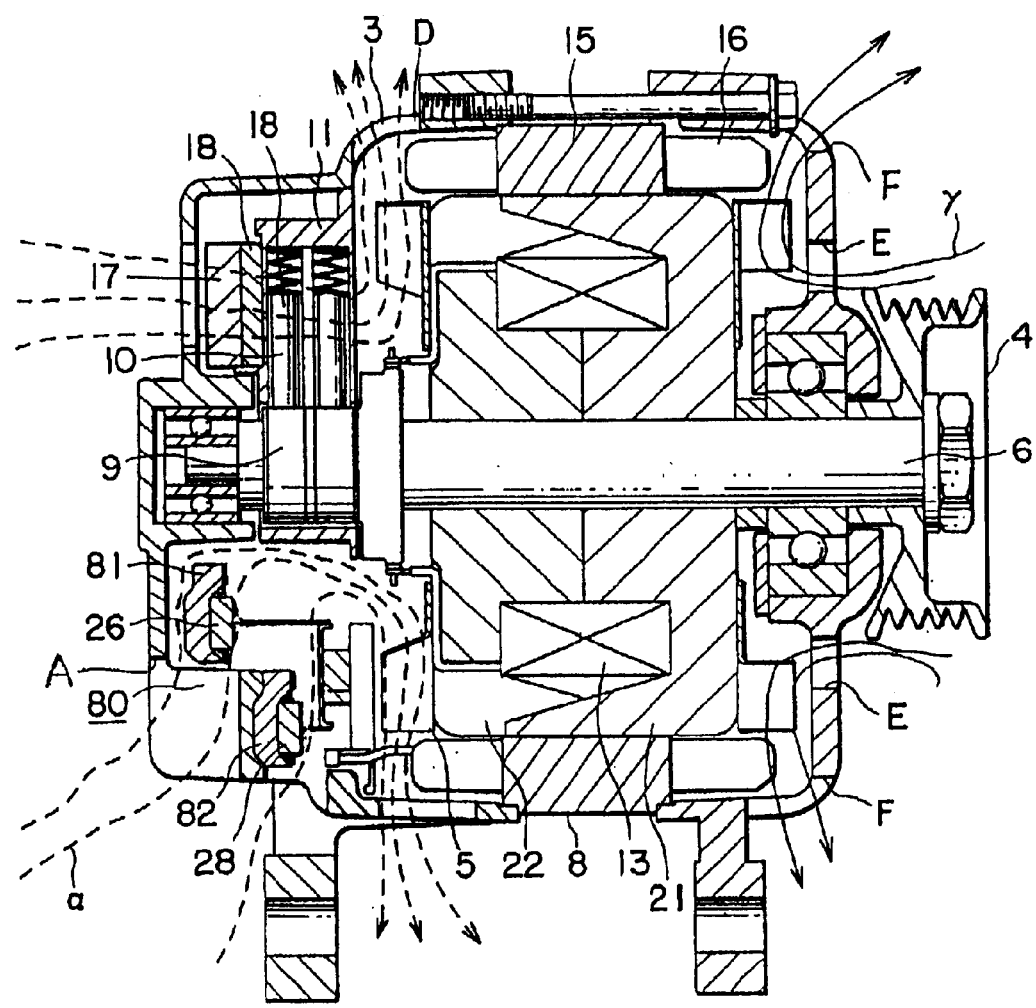
FIG. 8 is a front view of a rectifier of an automotive alternator according to a fourth embodiment of the present invention.

FIG. 8 is a sectional view of an automotive alternator according to a fourth embodiment of the present invention. The construction of the fourth embodiment is the same as that of the first embodiment except that a positive-side heat sink 81 and a negative-side heat sink 82 are disposed on different vertical planes with respect to an axis of a shaft 6.

In this embodiment, the positive-side heat sink and the negative-side heat sink are not on the same plane, so that ventilation drag on the planes is reduced, and a volume of air introduced through an aperture A is increased. This makes it possible to suppress a rise in temperature of positive-side diodes 51 and negative-side diodes 52.

Fifth Embodiment

In the embodiments described above, the columnar diodes project from the front surfaces of the heat sinks, and protuberances are formed on the rear surfaces to promote heat transfer by disturbance in the detached air portions on both surfaces. Alternatively, however, the inner diodes and the outer diodes may be accommodated in the recesses of the heat sinks so that the front surfaces of the diodes are flush with the front surfaces of the heat sinks.

More specifically, the protuberances jutting out of the rear surfaces of the heat sinks associated with the recesses housing the inner diodes may be disposed so that they are partly included in the areas of the detached air portion produced by collision against the protuberances jutting out of the rear surfaces of the heat sinks associated with the recesses housing the outer diodes. In this case, the heat transfer promotion effect from the disturbance in the detached air portion is obtained at the rear surfaces of the heat sinks.

Sixth Embodiment

Figure 9:
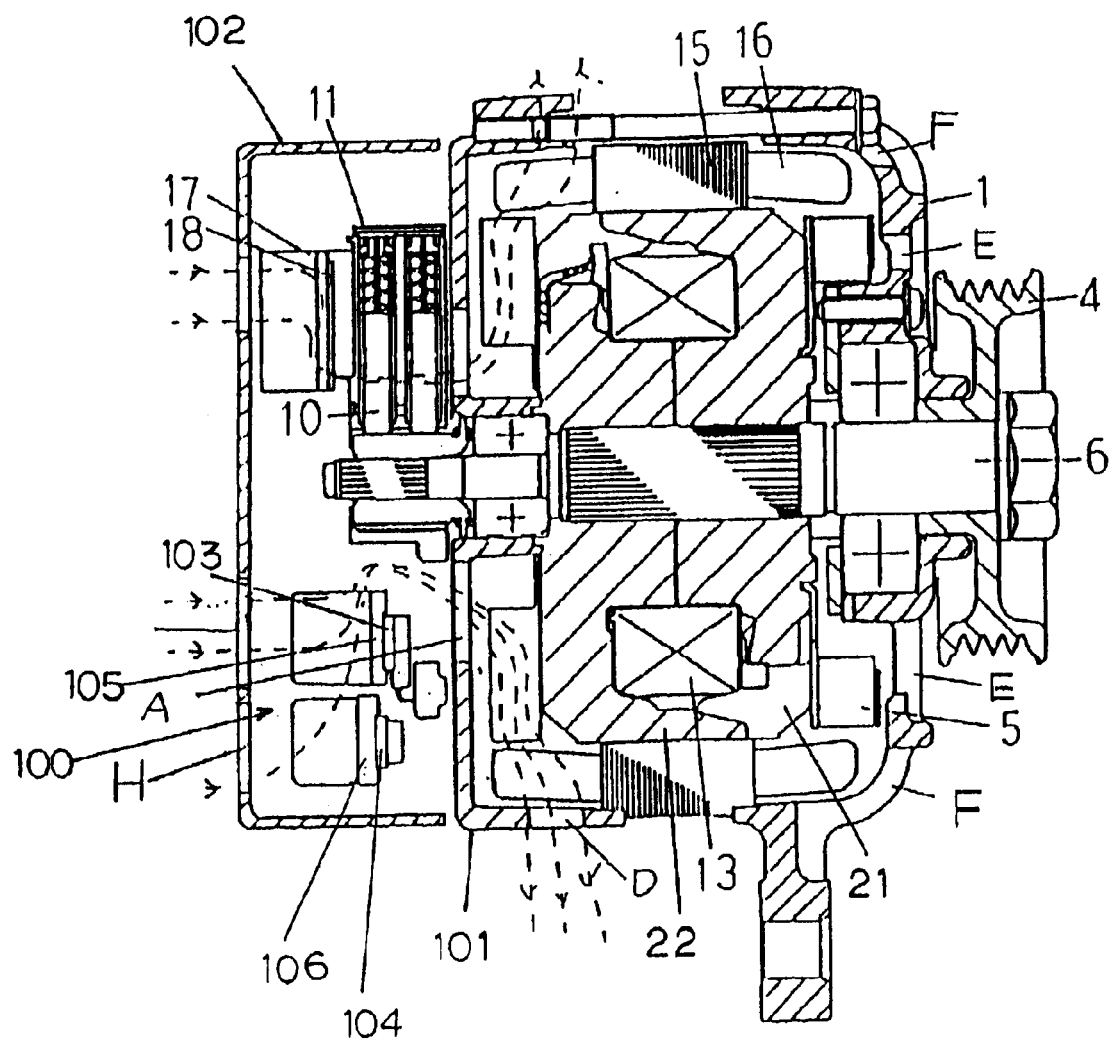
FIG. 9 is a sectional view of an automotive alternator according to a sixth embodiment of the present invention.
Figure 10:
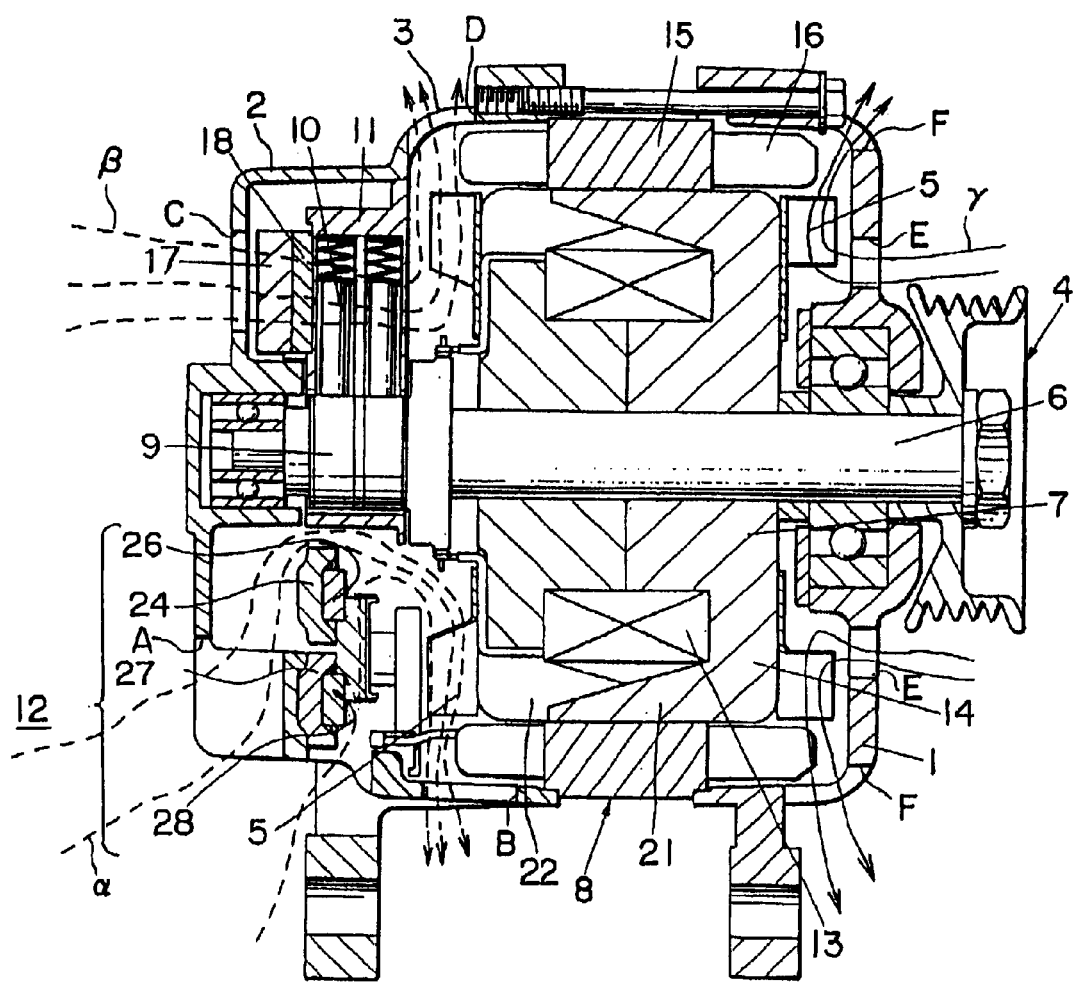
FIG. 10 is a sectional side elevation of a conventional automotive alternator.
Figure 11:
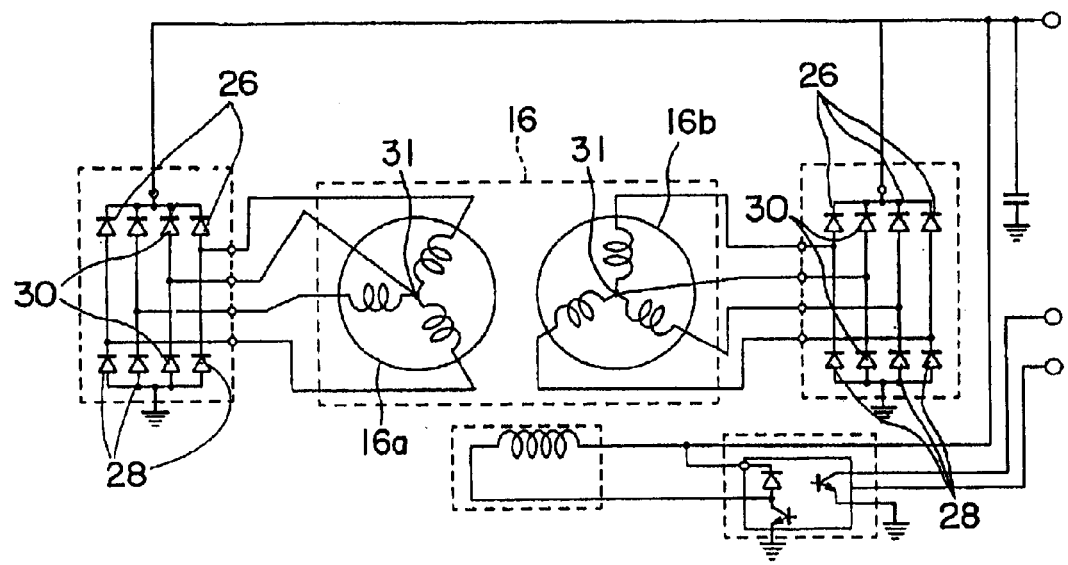
FIG. 11 is an electrical circuit diagram of the automotive alternator of FIG. 10.
Figure 12:
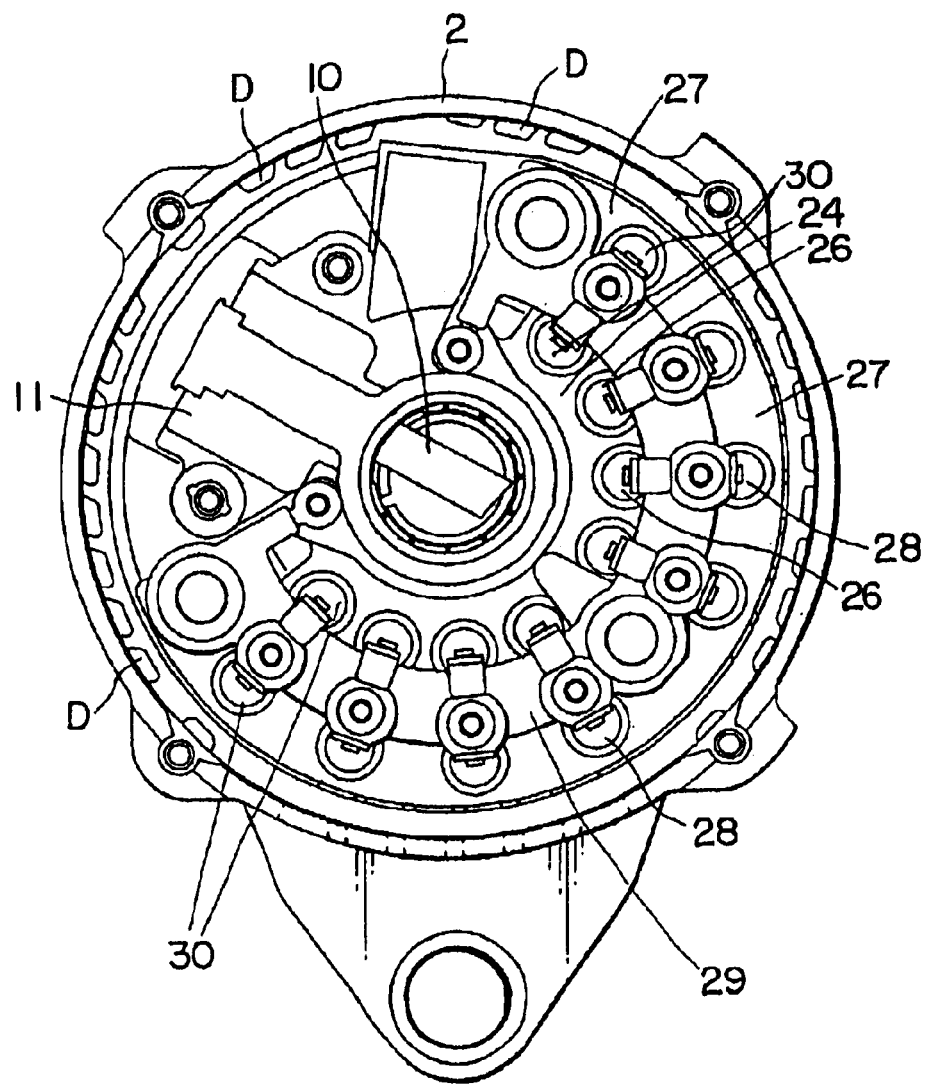
FIG. 12 is a front view of a rectifier of the automotive alternator shown in FIG. 10, as observed from inside thereof.
Figure 13:
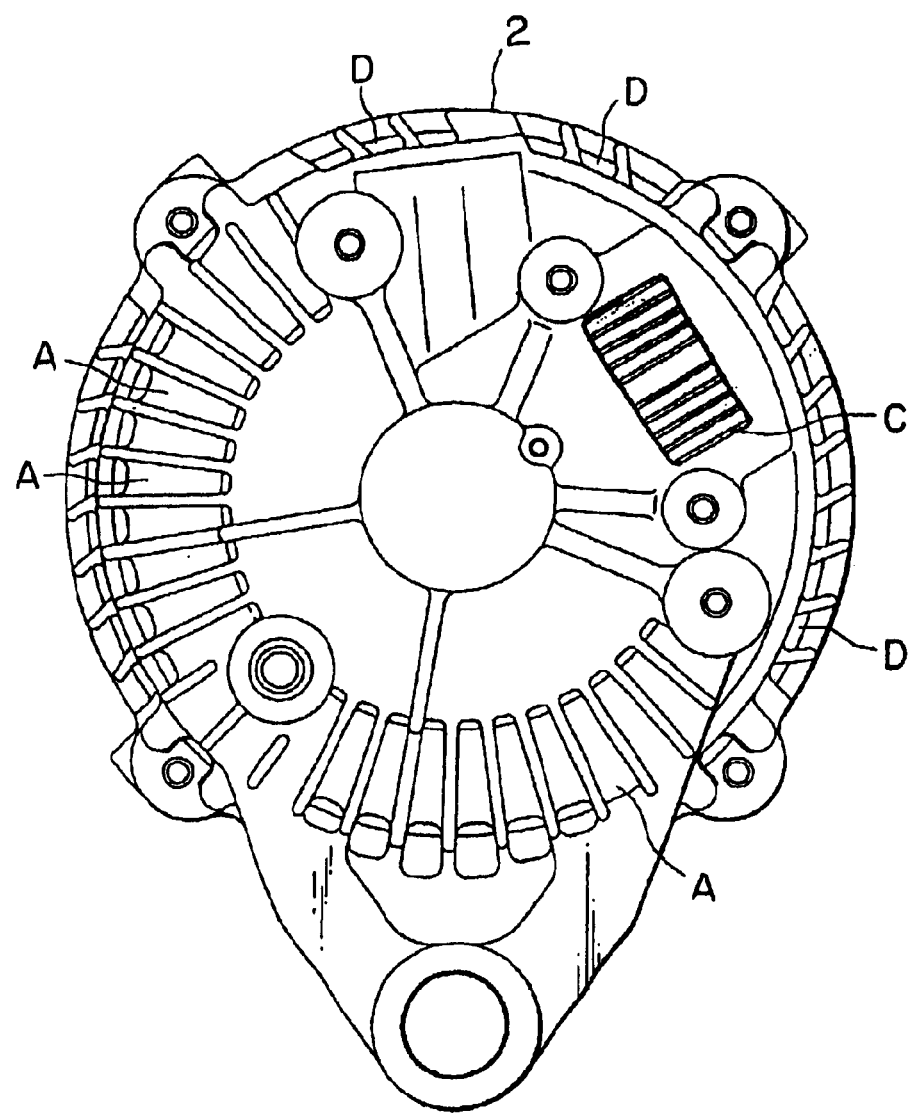
FIG. 13 is a front view of a rear bracket of the automotive alternator shown in FIG. 10.
Figure 14:
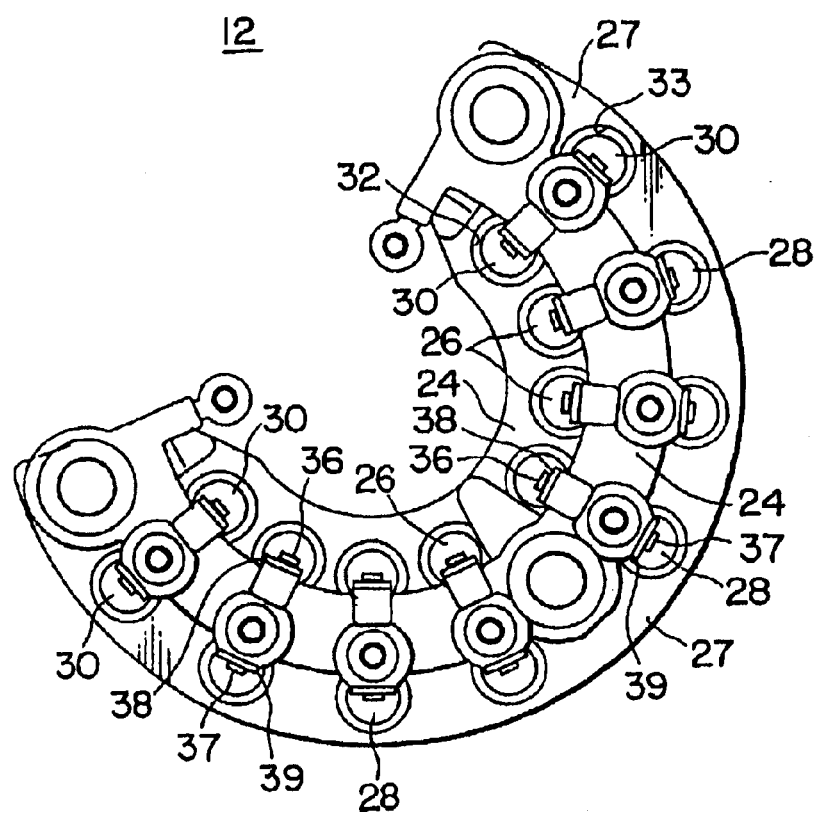
FIG. 14 is a front view of the rectifier shown in FIG. 10.
Figure 15:
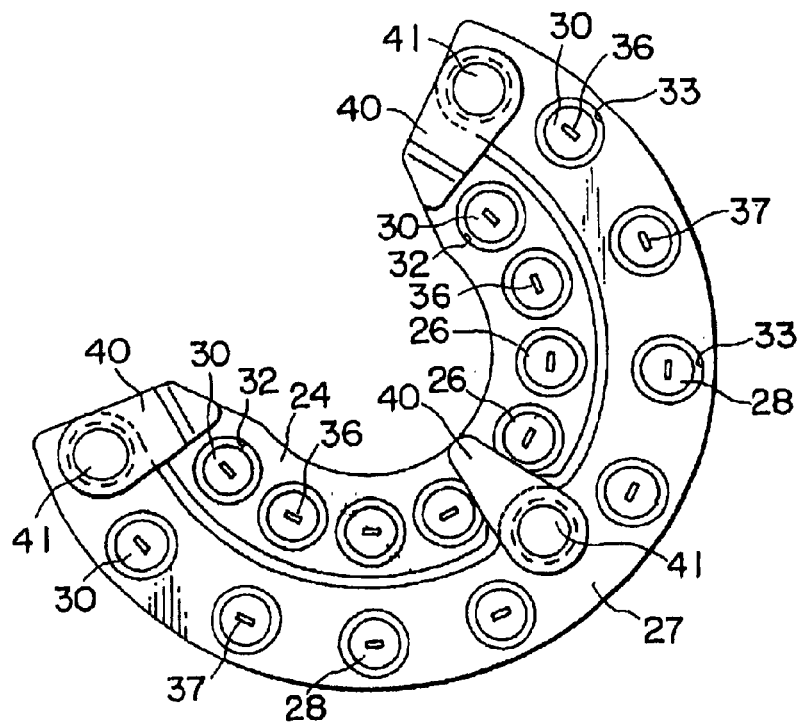
FIG. 15 is a front view of the rectifier shown in FIG. 10, from which a circuit board has been removed.
Figure 16:
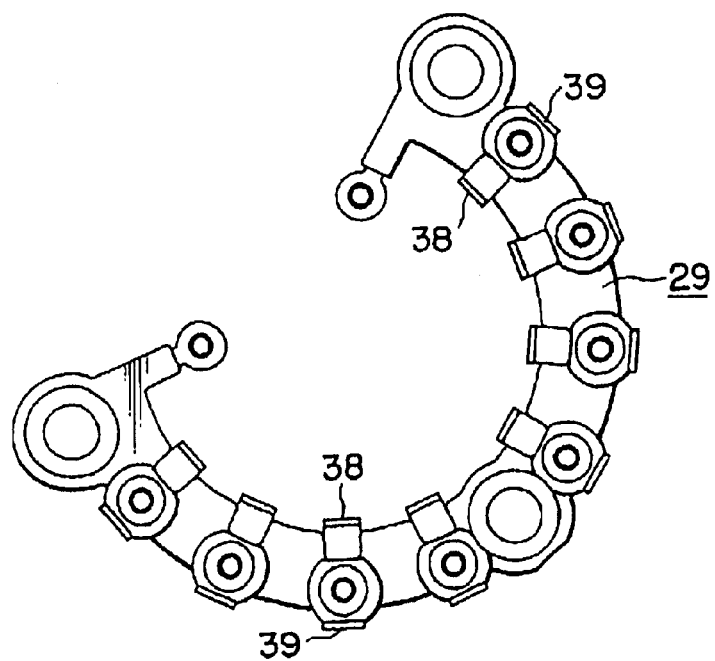
FIG. 16 is a front view of the circuit board shown in FIG. 14.
Figure 17:
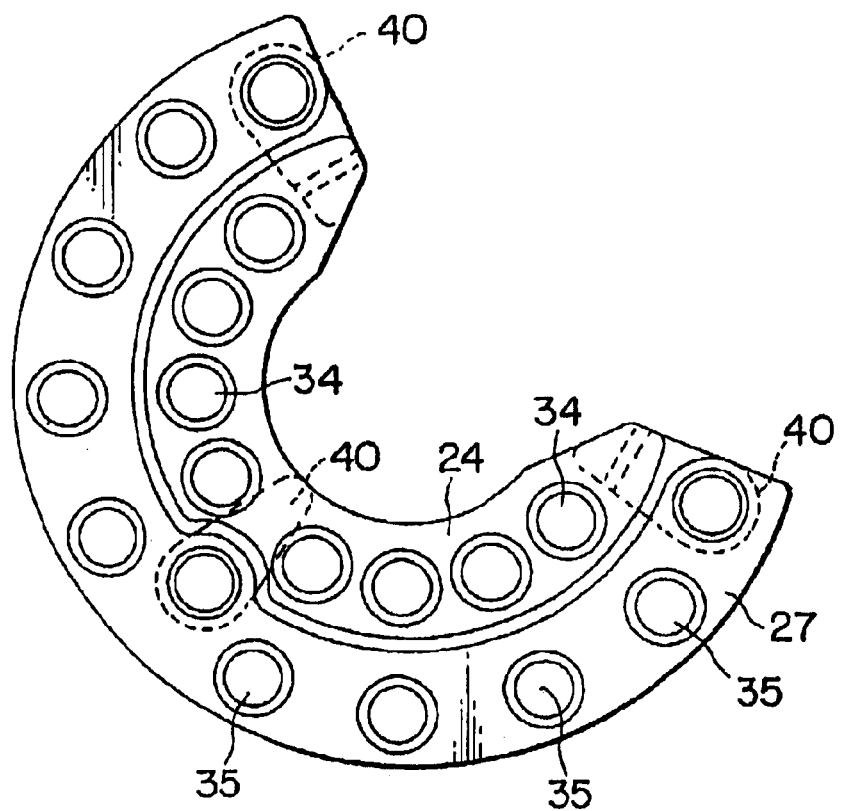
FIG. 17 is a rear view of the rectifier shown in FIG. 15.

FIG. 9 is a sectional view of an automotive alternator according to a sixth embodiment of the present invention.

In the above embodiments, the rectifier 50, 70, or 90 is housed in the case 3, while in the sixth embodiment, a rectifier 100 is housed in a cover 102 adjacent to a rear bracket 101. As in the case of the first embodiment, the rectifier 100 has inner and outer positive-side diodes 103 arranged in a zigzag pattern in a circumferential direction, and inner and outer negative-side diodes 104 arranged in the zigzag pattern in the circumferential direction. The inner positive-side diodes 103 are disposed so that they are partly included in an area of a detached air portion generated on a circumferential surface by cooling air that collides against the outer positive-side diodes 103. A positive-side heat sink 105 and a negative-side heat sink 106 are disposed on vertical planes that are different with respect to axes.

In the sixth embodiment, the inner positive-side diodes 103 are subjected to the influences of a detached air portion generated at the outer positive-side diodes 103, so that the inner positive-side diodes 103 are efficiently cooled, as in the case of the first embodiment. Furthermore, the negative-side heat sink 106 and the positive-side heat sink 105 are not on the same plane, so that ventilation drag on the planes is reduced, and a volume of air introduced through an aperture H of the cover 102 is increased. This makes it possible to suppress a rise in temperature of the positive-side diodes 103 and the negative-side diodes 104.

In the above embodiments, the negative-side heat sink is disposed on the outside diameter side, and the positive-side heat sink is disposed on the inside diameter side. Obviously, however, the present invention can be applied to a rectifier wherein the negative-side heat sink is disposed on the inside diameter side, and the positive-side heat sink is disposed on the outside diameter side.

The rectifier in each of the above embodiments is equipped with neutral point diodes connected to the neutral points, and four diodes are disposed in each heat sink. Alternatively, however, only three diodes per heat sink, which is a number of diodes required for three-phase full-wave rectification, may be used. Obviously, the present invention is also applicable to a case wherein a number of diodes disposed on the outer heat sink is greater than a number of diodes disposed on the inner heat sink.

Furthermore, only the positive-side diodes or the negative-side diodes may be arranged in the zigzag pattern in the circumferential direction.

The shape of the positive-side diodes and the negative-side diodes is not limited to the columnar shape; it may alternatively be a rectangular or polygonal shape.

In the above embodiments, the positive-side diodes are disposed so that only the inner positive-side diodes are disposed to be partly included in the area of the detached air portion. Alternatively, however, the negative-side diodes may be disposed so that the outer negative-side diodes are partly included in the area of the detached air portion.

Furthermore, in the above embodiments, the descriptions have been given of a case wherein the cooling air flows inward in the radial direction. The present invention, however, may also be applied to a case wherein the cooling air flows in the vicinity of the shaft into the case and moves outward in the radial direction. In this case, therefore, the outer diodes are efficiently cooled by the heat transfer promotion effect by the disturbance in the detached air portion caused by the inner diodes.

It is also obvious that the application of the present invention is not limited to an automotive alternator.

As described above, the present invention provides the following advantages.

As described above, in an alternator according to one aspect of the present invention, at least either the first diodes or the second diodes is composed of diodes on an inside diameter side and diodes on an outside diameter side that are arranged in a zigzag pattern in a circumferential direction. Therefore, the drag of the cooling air flowing into the rectifier is reduced, so that a cooling flow is increased, resulting in higher cooling efficiency of the rectifier. There is another advantage in that the rectifier can be made compact, and a degree of freedom for disposing the diodes is increased.

According to another form of the alternator, the diodes on the inside diameter side and the diodes on the outside diameter side may be provided in recessions of a heat sink having a recessed surface, and protuberances associated with the recesses may be formed in a rear surface of the heat sink. Therefore, An area of contact between the heat sinks and the cooling air is increased, leading to higher cooling efficiency of the diodes.

According to still another form of the alternator, one of the diode on the inside diameter side and the diode on the outside diameter side may be disposed such that it is partly included in a region of an air detachment portion produced on a peripheral surface by cooling air that collides with the other of the diode on the inside diameter side and the diode on the outside diameter side. Therefore, One of the inner diode or the outer diode is efficiently cooled by the heat transfer promotion effect by the disturbance in the detached air portion that takes place in the other of the inner diode or the outer diode.

According to still another form of the alternator, if a distance between a central point of a columnar diode on the inside diameter side and a central point of its adjacent columnar diode on the outside diameter side is denoted as W, and a diameter of the diode on the inside diameter side and the diode on the outside diameter side is denoted as D, then (W/D)<2, and if an angle at which a line connecting a central point of the diode on the inside diameter side and a central point of its adjacent diode on the outside diameter side crosses a line connecting a central axis of a shaft and the central point of the diode on the outside diameter side or the diode on the inside diameter side is denoted as θ, then angle θ is 100°<θ<140°. Therefore, one of the inner diode or the outer diode is efficiently cooled by securely benefiting from the heat transfer promotion effect by the disturbance in the detached air portion that takes place in the other of the inner diode or the outer diode.

According to still another form of the alternator, the diodes on the outside diameter side that are secured to the second heat sink may be disposed so as to oppose the diodes on the outside diameter side that are secured to the first heat sink. Therefore, A space between opposing diodes can be securely provided, making it possible to reduce the ventilation drag and increase the volume of air that collides against the outer diodes or the inner diodes.

According to still another form of the alternator, the diodes on the outside diameter side and the diodes on the inside diameter side that are secured to the second heat sink may be disposed away from radial lines of the diodes on the outside diameter side and the diodes on the inside diameter side that are secured to the first heat sink. Therefore, the volume of cooling air that collides against the diodes increases, permitting the diodes to be cooled further efficiently.

According to still another form of the alternator, the first heat sink and the second heat sink may be disposed on different vertical planes with respect to an axis. Therefore, The ventilation drag on the same plane is reduced, permitting the first diodes and the second diodes to be cooled further efficiently.

According to still another form of the alternator, the first heat sink may be a positive-side heat sink, the first diodes may be positive-side diodes, the second heat sink abutted against the case may be a negative-side heat sink, and the second diodes may be negative-side diodes. Therefore, the heat of the negative-side diodes is transmitted to the case due to heat conduction, permitting the negative-side diodes to be cooled further efficiently.

What is claimed is:

1. An alternator comprising:

a case;

a shaft rotatably provided in said case;

a rotor secured to said shaft;

a stator secured to said case and provided with a stator coil composed of a stator core around which a lead wire is wound; and a rectifier electrically collected to said stator coil and which rectifies an alternating current, which is generated in said stator coil, into direct current, wherein said rectifier comprises:

a first circular strip-shaped heat sink which is orthogonalized with said shaft and has a plurality of first diodes secured thereto; and a second circular strip-shaped heat sink which is provided outside said first heat sink so that it is orthogonalized with said shaft, and has a plurality of second diodes secured thereto;

at least one of said first diodes or said second diodes being composed of diodes on an inside diameter side and diodes on an outside diameter side that are arranged in a zigzag pattern in a circumferential direction, wherein one of said diodes on the inside diameter side and said diodes on the outside diameter side are disposed such that they are partly included in a region of an air detachment portion produced on a peripheral surface by cooling air that collides with the other of said diodes on the inside diameter side and said diodes on the outside diameter side.

2. An alternator according to claim 1, wherein said diodes on the inside diameter side and said diodes on the outside diameter side are provided in recessions of said first and second circular strip-shaped heat sinks having a recessed surface, and protuberances associated with said recesses are formed in a rear surface of said first and second circular strip-shaped heat sinks.

3. An alternator according to claim 1, wherein if a distance between a central point of a columnar diode on the inside diameter side and a central point of its adjacent columnar diode on the outside diameter side is denoted as W, and a diameter of said diode on the inside diameter side and said diode on the outside diameter side is denoted as D, then (W/D)<2, and if an angle at which a line connecting a central point of said diode on the inside diameter side and a central point of its adjacent diode on the outside diameter side crosses a line connecting a central axis of said shaft and the central point of said diode on the outside diameter side or said diode on the inside diameter side is denoted as $\theta$, then angle $\theta$ is $100°<\theta<140°$.

4. An alternator according to claim 1, wherein said diodes on the outside diameter side that are secured to said second heat sink are disposed so as to oppose said diodes on the outside diameter side that are secured to said first heat sink.

5. An alternator according to claim 1, wherein said diodes on the outside diameter side and said diodes on the inside diameter side that are secured to said second heat sink are disposed away from radial lines of said diodes on the outside diameter side and said diodes on the inside diameter side that are secured to said first heat sink.

6. An alternator according to claim 1, wherein said first heat sink and said second heat sink are disposed on different vertical planes with respect to an axis.

7. An alternator according to claim 1, wherein said first heat sink is a positive-side heat sink, said first diodes are positive-side diodes, said second heat sink abutted against said case is a negative-side heat sink, and said second diodes are negative-side diodes.

* * * * *